United States Patent
Kyogoku

(10) Patent No.: US 8,928,714 B2
(45) Date of Patent: Jan. 6, 2015

(54) SEMICONDUCTOR LASER DRIVER AND IMAGE FORMING APPARATUS INCORPORATING SAME

(75) Inventor: Hiroaki Kyogoku, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 39 days.

(21) Appl. No.: 13/051,256

(22) Filed: Mar. 18, 2011

(65) Prior Publication Data
US 2011/0228036 A1    Sep. 22, 2011

(30) Foreign Application Priority Data
Mar. 18, 2010    (JP) .................. 2010-062449

(51) Int. Cl.
| | | |
|---|---|---|
| B41J 2/385 | (2006.01) | |
| B41J 2/41 | (2006.01) | |
| B41J 2/435 | (2006.01) | |
| B41J 2/47 | (2006.01) | |
| B41J 2/455 | (2006.01) | |
| G02B 26/12 | (2006.01) | |
| G03G 15/043 | (2006.01) | |
| H01S 5/042 | (2006.01) | |
| H01S 5/06 | (2006.01) | |

(52) U.S. Cl.
CPC .............. *B41J 2/471* (2013.01); *G02B 26/127* (2013.01); *G03G 15/043* (2013.01); *G03G 2215/0404* (2013.01); *H01S 5/042* (2013.01); *H01S 5/0617* (2013.01)
USPC ........... 347/237; 347/130; 347/132; 347/238; 347/247

(58) Field of Classification Search
CPC ............ B41J 12/385; B41J 2/41; B41J 2/435; B41J 2/47; B41J 2/455; B41J 2/45
USPC ......... 347/111, 112, 129, 130, 132, 224, 225, 347/233, 237, 238, 247
See application file for complete search history.

(56) References Cited

U.S. PATENT DOCUMENTS 5,912,694 A * 6/1999 Miyake et al. ............... 347/247
6,498,617 B1 * 12/2002 Ishida et al. ................. 347/252
(Continued)

FOREIGN PATENT DOCUMENTS

| JP | 9-164722 | 6/1997 |
|---|---|---|
| JP | 2000-216470 | 8/2000 |

(Continued)

OTHER PUBLICATIONS

Japanese official action dated Nov. 26, 2013 in corresponding Japanese patent application No. 2010-62449.

(Continued)

*Primary Examiner* — Justin Seo
*Assistant Examiner* — Kendrick Liu
(74) *Attorney, Agent, or Firm* — Cooper & Dunham LLP

(57) ABSTRACT

A semiconductor laser driver to drive at least one semiconductor laser, the semiconductor laser including a storage device, an emission-intensity setting device, and a drive circuit. The storage device stores emission-intensity switching data to control light-emission intensity of the semiconductor laser, the emission-intensity setting device sets the light-emission intensity based on the emission-intensity switching data stored in the storage device, and, the drive circuit generates a driving current to drive the semiconductor laser based on the light-emission intensity set in the emission-intensity setting device.

12 Claims, 9 Drawing Sheets

(56) References Cited

U.S. PATENT DOCUMENTS

| | | | |
|---|---|---|---|
| 2003/0001945 A1* | 1/2003 | Maeda | 347/252 |
| 2004/0228374 A1 | 11/2004 | Inukai | |
| 2007/0216756 A1* | 9/2007 | Komiya et al. | 347/246 |
| 2008/0013578 A1* | 1/2008 | Moriya | 372/38.02 |
| 2008/0212627 A1* | 9/2008 | Abe | 372/38.02 |

FOREIGN PATENT DOCUMENTS

| | | |
|---|---|---|
| JP | 2001-150726 | 6/2001 |
| JP | 3466599 | 8/2003 |
| JP | 2004-342655 | 12/2004 |
| JP | 3880914 | 11/2006 |
| JP | 2007-73543 | 3/2007 |
| JP | 4108321 | 4/2008 |
| JP | 2009-164191 | 7/2009 |
| JP | 4427277 | 12/2009 |
| JP | 4471597 | 3/2010 |

OTHER PUBLICATIONS

Japanese official action dated Jul. 29, 2014 in corresponding Japanese patent application No. 2010-062449.

* cited by examiner

SEMICONDUCTOR LASER DRIVER AND IMAGE FORMING APPARATUS INCORPORATING SAME

TECHNICAL FIELD

The present disclosure relates to a semiconductor laser driver, and an image forming apparatus including the semiconductor laser driver.

BACKGROUND ART

Recently, semiconductor laser diodes have come to be widely used in a variety of types of electrical equipment, for example, laser printers, optical disk apparatuses, fiber-optic communication apparatuses, and mobile phones, because of their compact size, low cost, and ease of use.

However, the current/light-emission intensity characteristics of the semiconductor laser diode are dependent on temperature. Accordingly, it is necessary to control emission intensity to obtain a predetermined emission intensity reliably. This emission intensity control is called Automatic Power Control (APC). In the APC process, before the semiconductor laser diode is actually driven, the laser diode is driven in advance, quantity of light output from the laser diode is received by a photo diode (PD), and the detection current values of corresponding quantities of light are stored in a storage device. Then, the laser diode is controlled using the current values saved in the storage device so as to obtain a desired emission intensity reliably.

High resolution and high-speed operation are required of contemporary printers and copiers, including those that employ a semiconductor laser as a light source. In a case in which there is only a single laser beam used, in order to improve image resolution and printing speed it is necessary to increase modulation speed, which is the speed at which the semiconductor laser is driven (turned on and off) in accordance with the input image data. However, there is a limit to the modulation speed. Accordingly, in order to improve image resolution and operating speed without increasing the modulation speed, there is no alternative but to increase the number of laser beams.

In a case in which four laser beams are used, when it is assumed that the modulation speed and the printing speed are to the same as in a case in which a single beam is set in the laser light, the image resolution in the main-scanning direction and sub-scanning direction (horizontal and vertical directions) can be doubled. Alternately, in this case, when the image resolution is the same as a case in which a single beam is set in the laser light, the printing speed can be quadrupled.

As for the semiconductor laser used for the light source, edge-emitting laser elements (hereinafter "edge-emitting lasers") that emit laser light parallel to the activation layer are widely used. When the edge-emitting laser is used, the number of beams is set to a single laser beam, or two or four multi-beam lasers are used in the printers and copiers. Since an optical axis between the lasers of the multi-beam laser is stable, when the multiple beams are required, it facilitates adjustment of the optical axis between the adjacent lasers by using the multi-beam laser rather than by adjusting multiple individual single lasers in the apparatus separately.

Generally, a laser unit of the edge-emitting laser includes a single photo-receiver element in addition to a multi-beam laser. The edge-emitting laser emits laser light backward (back projection) proportional to a front projecting power as used as the laser light, and the photo-receiver element PD installed in the laser unit receives the back projection and generates a monitor current similarly proportional to the quantity of light received. In the multi-beam laser, even when the powers of front projection for respective laser diodes are identical, the monitor currents thus generated are slightly different among the beams due to individual variability.

FIG. 1 is a conceptual diagram of a related art laser (LD) board 700 mounting a related art laser driver 7 and a main board 60X mounting an image control unit 6, provided in an image forming apparatus. In the image forming apparatus, the optical unit, such as, the semiconductor laser driver 7, a laser unit, a polygon mirror, and the scanning lenses are configured as a laser scan unit (hereinafter "LSU"). In order to activate the semiconductor laser LD rapidly, the semiconductor laser driver 7 and the laser unit 1 are provided in a same LD board 7000, and disposed close to each other. It is preferable that the LD board is small so as to dispose the gap among the LSU. By contrast, the image control unit 6 is installed in a main board 60X including a central processing unit (CPU), random access memory (RAM), read only memory (ROM), and an image memory.

Herein, the semiconductor laser driver 7 mounted in the LD board 700 and the image control unit 6 mounted in the main board 60X are connected via a cable that is usually longer than 1 m. A supply voltage from a power supply and a ground voltage (GND) are supplied from the main board 60X to the LD board 700 via the cable. Because a consumption current of the semiconductor laser driver 7 and a driving current for emitting the semiconductor laser LD are transmitted through voltage-transmission lines connecting to the power supply or the ground voltage, voltage drop and voltage boost are generated in the voltage transmission lines by resistance of the cable.

Thus, voltage generated in the image control unit 6 differs from the voltage received in the semiconductor laser driver 7 in direct current (DC). In addition, the current fluctuates due to switching the laser diode LD on and off during image formation, and accordingly the supply voltage and the ground voltage in the LD board 700 fluctuate from point of an alternative current (AC). Thus, since the voltage fluctuates in the cable therebetween from the point of DC and AC, error may be generated in the emission amount (emission intensity) with respect to a setting value of the quantity of light.

In addition, of late there is market demand for a semiconductor laser driver that is capable of controlling the light-emission amount of the semiconductor laser with ever more precise timing, in order to cut cost and improve image quality.

SUMMARY

This patent specification describes a novel semiconductor driver. In as aspect of this disclosure, there is provided a semiconductor laser driver to drive at least one semiconductor laser, including a storage device, an emission-intensity setting device, and a drive circuit. The storage device stores emission-intensity switching data to control light-emission intensity of the semiconductor laser, the emission-intensity setting device sets the light-emission intensity based on the emission-intensity switching data stored in the storage device, and, the drive circuit generates a driving current to drive the semiconductor laser based on the light-emission intensity set in the emission-intensity setting device.

Additional aspects, there is provided an image forming apparatus including at least one semiconductor laser to emit light, an image control unit to generate image data and an automatic power control signal to obtain a predetermined light-emission intensity of light for the semiconductor laser, and the above-described semiconductor laser driver to receive the image data and the automatic power control signal output from the image control unit.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
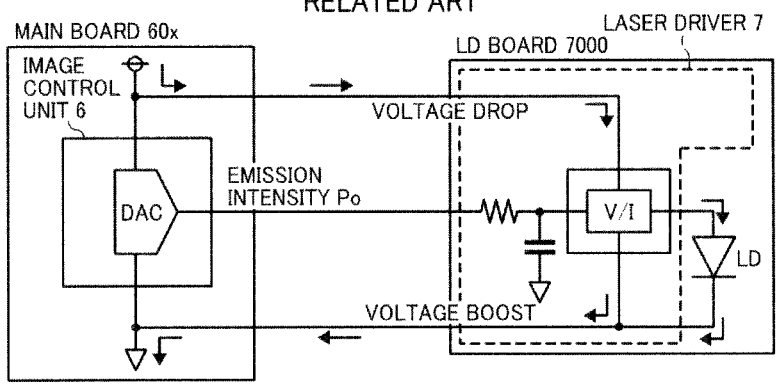
FIG. 1 illustrates a conceptual diagram of a related art laser board including a semiconductor laser driver and a main board including an image control unit.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Figure 4:
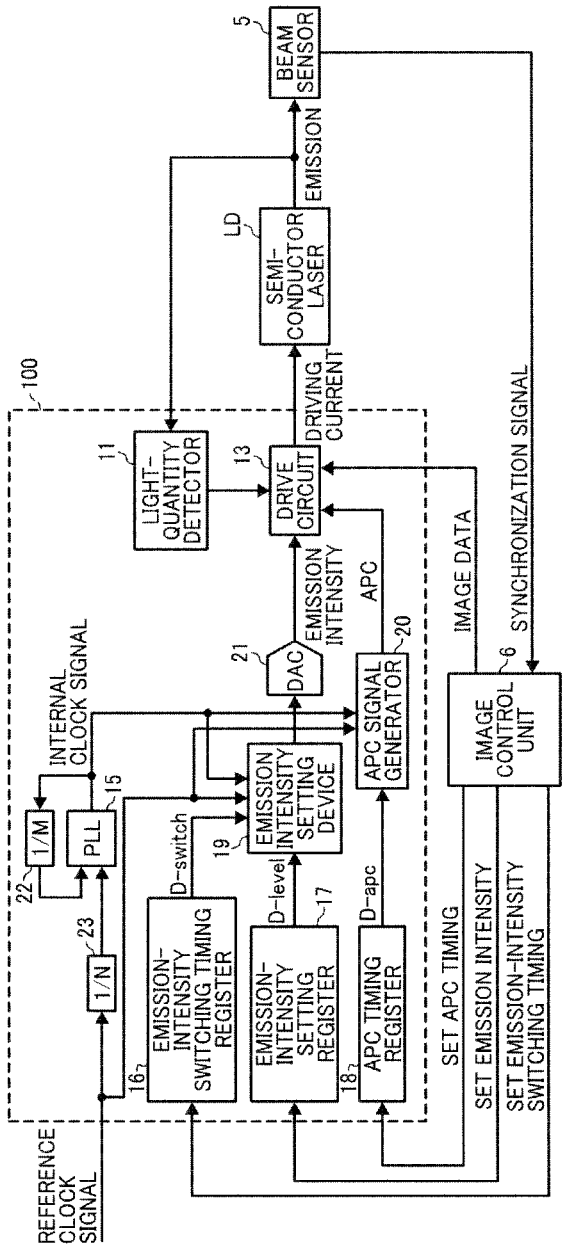
FIG. 4 is a block diagram illustrating the laser driver shown in FIG. 3.

Referring now to the drawings, wherein like reference numerals designate identical or corresponding parts throughout the several views, particularly to FIG. 4, a semiconductor laser driver 100 according to an illustrative embodiment is described.

Figure 2:
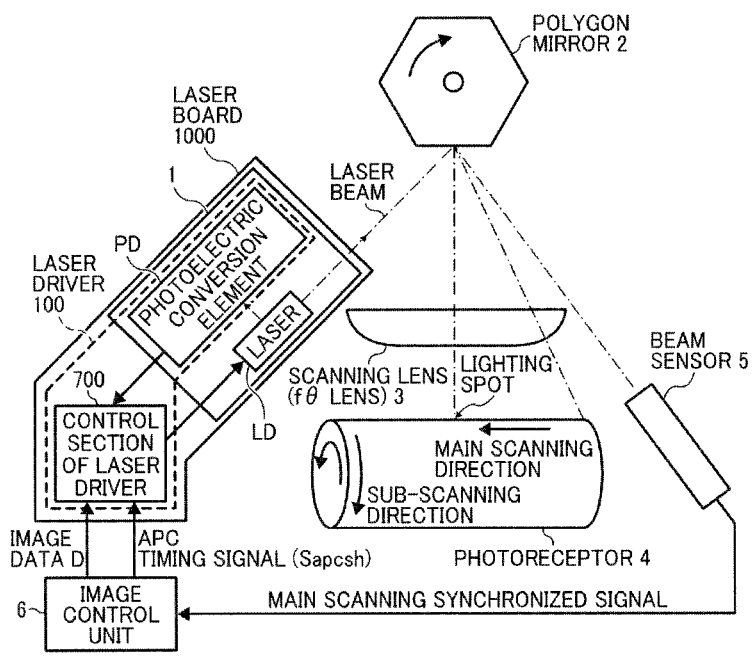
FIG. 2 is a block diagram of an image forming apparatus including a semiconductor laser driver according to a first illustrative embodiment.

FIG. 2 is a schematic diagram of an image forming apparatus 200 according to the present embodiment. As illustrated in FIG. 2, the image forming apparatus 200 may be a copier, a facsimile machine, a printer, a multifunction printer using electrophotographic process used in a copier, a facsimile machine, a printer, a multifunction printer having at least one of copying, printing, scanning, plotter, and facsimile functions, or the like.

In FIG. 2, the image forming apparatus 200 includes a semiconductor laser unit 1 (edge-emitting laser) 1, a polygon mirror 2, a scanning lens 3, a photoreceptor 4, a beam sensor 5, an image control unit 6, and a laser drier 100. The semiconductor laser unit 1 and the laser driver 100 are integrated onto a same laser board.

In an image forming process, a semiconductor laser diode LD of the edge-emitting laser functioning as a light source in the semiconductor laser unit 1 emits two laser beams, and the laser beams are scanned (deflected) by the polygon mirror 2 that rotates at a predetermined velocity. Then, the each lased beam forms a lighting spot on the photoreceptor 4 (scanned medium) via the scanning lens 3 (f θ lens).

The deflected laser beam scans and exposes in a main scanning direction orthogonal to a sub-scanning direction in which the photoreceptor 4 rotates, and then, image signals are recorded with respect to each line thereof.

The beam sensor 5 is disposed at a position at which the laser beam is radiated, that is, a position close to the one end of the photoreceptor 4, to generate a main scanning synchronized signal. The image control unit 6 generates image data D and an automatic power control (APC) timing signal Sapcsh synchronized with the main scanning synchronized signal from the laser beam sensor 5. The laser driver 100 controls power of emission intensities of the semiconductor laser LD based on the APC timing signal Sapcsh, and the emission of the semiconductor laser LD, synchronized with the image data D.

While the semiconductor driver 100 controls the emission time of the semiconductor laser LD based on the APC timing signal Sapcsh generated in the image control unit 6, the laser LD repeatedly scans the image data D on the photoreceptor 4 in the main scanning direction in a predetermined cycle in accordance with a rotation velocity and a recording density, thus forming a latent image on a surface of the photoreceptor 4.

In the electrophotographic process using multi-beam-laser, due to differences in transmissivity and reflectance of the lenses constructing the laser unit 1, lighting powers on the photoreceptor 4 are different even when the quantities of light (emitting amount) of the respective laser beams are identical. That is, in order to set the respective lighting powers on the photoreceptor 4, the emitting amounts of the respective laser beams must be set separately.

Similarly, in a multicolor image forming apparatus, the receptive colors on the photoreceptors are assigned to multiple laser beams generated in the multiple lasers, and powers of the light-emission intensities (the emitting amount) for the respective laser beams for corresponding colors on the photoreceptor 4 must be set separately.

Figure 3:
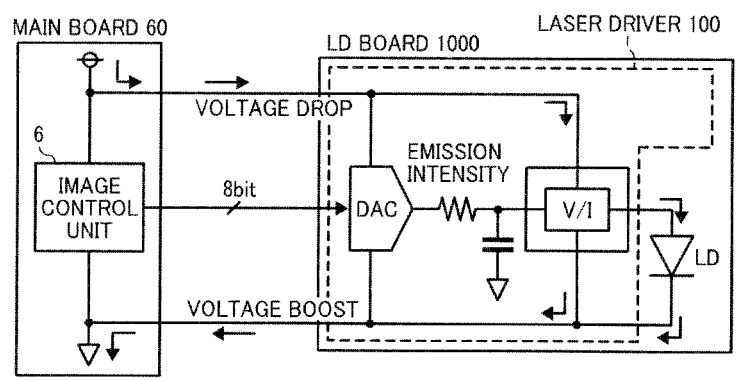
FIG. 3 is a conceptual diagram of a laser board including a semiconductor laser driver and a main board including an image control unit shown in FIG. 2.

FIG. 3 is a schematic diagram illustrating a semiconductor laser driver 100 according to the first embodiment. In a comparative example, the data to set the light-emission intensities of the semiconductor laser LD is sent from the image control unit 6 mounted in a main board 60x (see FIG. 1) to the semiconductor laser driver 7 mounted in a laser board 7000 by an analog voltage.

By contrast, in the present embodiment, the semiconductor laser driver 100 includes an analog voltage generation circuit constructed of a digital-analog converter (DAC), to determine the light-emission intensity. Thus, the effects of the voltage down (drops) and the voltage up (boosts) due to the resistance of the cable connected between the image control unit 6 mounted in a main board 60 and the semiconductor laser driver 100 mounted in a laser board 1000 can be eliminated, enabling stable light-emission intensity.

(Configuration of Semiconductor Laser Driver)

A configuration of the semiconductor laser driver 100 according to the present embodiment is described below with reference to FIG. 4.

FIG. 4 is a block diagram illustrating vicinity of the semiconductor laser driver 100 according to the present embodiment. The semiconductor laser driver 100 includes a light-quantity detection unit 11 that detects quantity of light emitted from the semiconductor LD and a drive circuit that generates a driving current Iop for the semiconductor LD in accordance with the quantity of light detected by the light-quantity detention unit 11 and image data emitted from the image control unit 6 (see FIG. 2) and controls the driving current Iop.

The semiconductor laser driver 100 further includes a phase locked loop (PLL) circuit 15, an emission-intensity switching timing register 16, an emission-intensity setting register 17, an automatic power control (APC) timing register 18, an emission-intensity setting device 19, an APC signal generator 20, a digital-analog converter (DAC) 21, a 1/M divider 22, and a 1/N divider 23. The PLL circuit 15 generates an internal clock signal. The emission-intensity switching timing register 16 stores data to store a switching timing of the emission intensity. The emission-intensity setting register 17 stores data to set a light level of the emission intensity. The APC timing register 18 stores data to generate an APC signal in the APC signal generator 20 as a synchronization signal under APC.

The emission-intensity setting device 19 sets the level of the light-emission intensity. The DAC 21 converts the driving current Ipo into an analog voltage representing the light-emission intensity.

Figure 5:
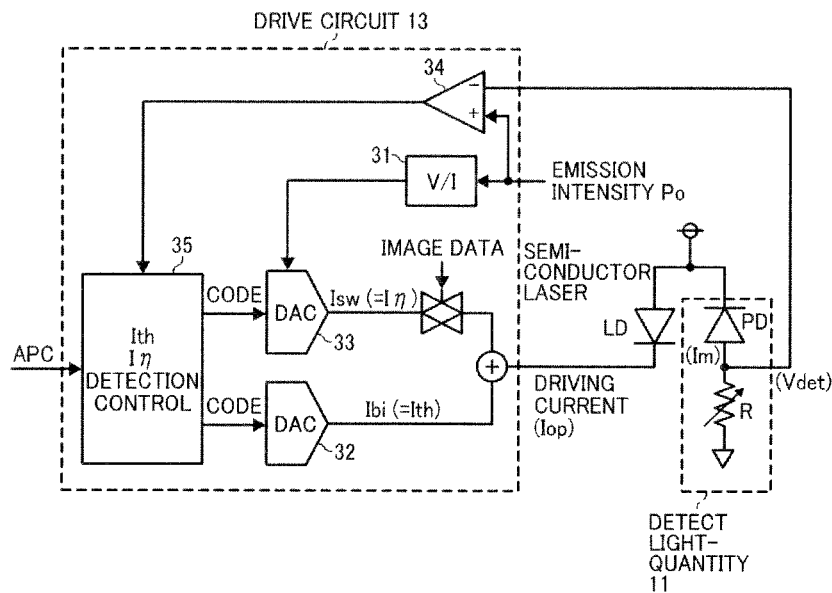
FIG. 5 is a block diagram illustrating vicinity of a drive circuit in the laser driver shown in FIG. 4.

FIG. 5 is a block diagram illustrating the vicinity of the drive circuit 13. In FIG. 5, the light-quantity detection unit 11 includes light-receiver element (photoelectric conversion element) PD and a resistor R. The light-receiver element PD generates a monitor current Im in accordance with the quantity of light of the semiconductor laser LD, and the resistor R converts the monitor current Im from the light-receiver element into a voltage and outputs the detected voltage Vdet to the drive circuit 13.

As illustrated in FIG. 5, the drive circuit 13 includes an IthIη detection controller 31, digital analog converters (DAC) 32 and 33, a switch 34, and adder 35.

The APC signal generated in the image control unit 6 is inputted to the IthIη detection controller 31, and the IthIη detection controller 31 outputs a code corresponding to a threshold current Ith and a code corresponding to an emission current Iη.

The threshold current Ith and the emission current Iη are described blow.

Figure 6:
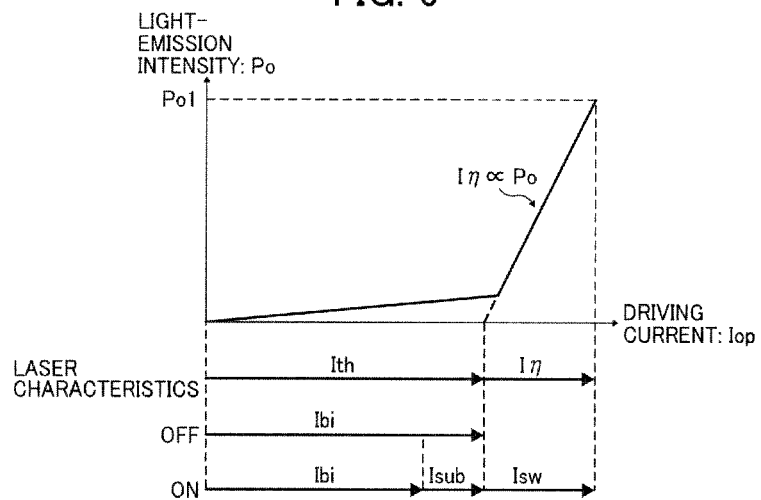
FIG. 6 is a graph illustrating a light-current feature curve between a current-light feature of emission intensities of a semiconductor laser and a light-current feature of a driving current of the semiconductor laser.

FIG. 6 is a diagram illustrating a feature of emission amount (emission intensity) with respect to the driving current Iop of the semiconductor laser LD. As illustrated in FIG. 6, the semiconductor laser LD starts rapidly emitting a predetermined current value as a border current. The border current that the semiconductor laser LD starts rapidly emitting is the threshold current Ith. The emission current Iη is a current equal to or larger than the threshold current Ith. The emission current Iη of the semiconductor laser LD is proportional to the emission amount (Po) of the semiconductor laser LD. In the normal process, a general semiconductor laser driver 100 constantly supplies a bias current Ibi in spite of a period during which there is no image formation. The bias current Ibi is set a value slightly smaller than the threshold current Ith.

Next, operations of the registers 16, 17, and 18 are described below.

The emission-intensity switching timing register 16 stores the data to set light level of the light-emission intensity. The switching timing data D-switch for setting emission intensity is acquired from the image control unit 6 when power supply is turned on and then is stored in the emission-intensity switching timing register 16. The switching timing data D-switch for setting emission intensity is the data indicating a period during which predetermined light-emission intensity is kept. For example, the switching timing data D-switch is expressed by the number of counted internal clock signals.

The emission-intensity setting register 17 stores the data to set the light level of the light-emission intensity, and the setting data D-level of the emission-intensity is set for each multiple selectable predetermined levels of the light-emission intensities.

The APC timing register 18 stores data to generate the APC signal in the APC signal generator 20 as a synchronization signal under APC. The APC timing setting data D-apc indicates a cycle of the APC signal. For example, the APC timing setting data D-apc is expressed by the number of the internal clock signals.

In the above-described configured semiconductor laser driver 100, the drive circuit 13 supplies the driving current Iop to the semiconductor laser LD and causes the semiconductor laser to emit. At this time, the quantity of light of the semiconductor LS is detected by the light-quantity detection unit 11, and the detention result is input to the drive circuit 13. The drive circuit 13 controls the driving current Iop such that the light-emission intensity of the semiconductor laser LD becomes a desired value.

(Setting Light-Emission Intensity)

Next, setting the light-emission intensity of the semiconductor laser LD in the semiconductor laser driver 100 is described below, with reference to FIG. 7.

Figure 7:
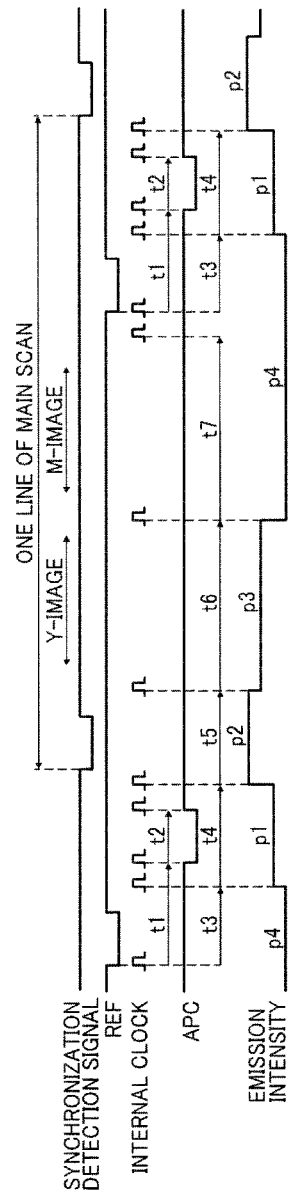
FIG. 7 is a timing chart illustrating setting light-emission intensity of the semiconductor laser in the semiconductor laser driver shown in FIG. 4.

FIG. 7 is a timing chart illustrating setting the light-emission intensity of the semiconductor laser LD in the semiconductor laser driver 100. In FIG. 7, a synchronization detection signal indicates a synchronization signal in a main scanning direction output from a beam sensor so as to recognize where the lighting position (lighting spot see FIG. 2) is on the photoconductor 4 receiving the laser beam emitted from the semiconductor laser LD.

In the example illustrated in FIG. 7, the emission-intensity setting register 17 stores four light-emission intensities, p1, p2, p3, and p4, as the light level data D-level of the light-emission intensities.

In addition, the emission-intensity switching timing register 16 stores the number of the internal clock signals corresponding to time periods t3, t4, t5, t6, and t7 for respective light-emission intensities p4, p1, p2, p3, and p4 as the switch timing data D-switch of the respective emission intensities.

The APC timing register 18 stores the number of internal clock signals corresponding to the time periods t1 and t2 as the APC signal generation data D-apc.

The switch timing data D-switch for setting emission intensity, the light level data D-level for setting the light-emission intensity, and the data D-apc for generating APC signal (s) are transmitted from the image control unit 6 to the respective registers 16, 17, and 18 when the power supply is turned on. Subsequently, the data (D-switch, D-level, D-apc) are read out from the registers 16, 17, and 18 and are used for controlling the light-emission intensity of the semiconductor laser LD.

Reference clock signals that have a predetermined cycle are input to the PLL circuit 15. Then, the PLL circuit 15 converts frequency of the reference clock signal into high-frequency clock signals by multiplying the frequency of the reference clock signal by predetermined integer magnifications, and generates internal clock signals whose frequency is higher than that of the reference clock signal. Herein, the PLL circuit 15 functions as a storage device that stores data for multiplying a frequency of a reference clock signal having a predetermined cycle by predetermined integer magnifications and generating a clock signal whose clock frequency is higher than the frequency of the reference clock signal as the emission-intensity switching data.

The APC signal generator 20 reads out the APC signal generation data D-apc from the APC timing register 18 and generates the APC signal based on the data D-apc, the reference clock signals, and the internal clock signals. For example, as shown in FIG. 7, in a state in which the APC timing register 18 stores "m" of the counted internal clock signals corresponding to the time period t1 and "n" of the counted internal clock signals corresponding to the time period t2, the APC signal generator 20 starts counting when the reference clock signal falls. Subsequently, the APC signal generator 20 generates the APC signal such that the APC signal remains high until the number of the internal clock signals counted reaches "m", that is, until the time period "t1" has elapsed. Then, the APC signal is kept low until the number of the internal clocks counted reaches "n" that is, until a time period "t2" has elapsed.

The emission-intensity setting device 19 determines the switch timing based on the switch timing data D-switch for the light-emission intensity output from the emission-intensity switching timing register 16, the reference clock signals, and the internal clock signals. The emission-intensity setting device 19 also reads out the light level data D-level for setting the emission intensities from the emission-intensity setting register 17. The emission-intensity setting device 19 outputs the light level data D-level of the light-emission intensity (digital signal) to the DAC 21 in accordance with the determined switching timing while switching the levels of the light-emission intensities based on the switching timing.

For example, as shown in FIG. 7, the emission-intensity setting device 19 sets the level of the light-emission intensity at "p1" after the time period t3 has elapsed from the time point at which the reference clock signal falls and then changes the level of the light-emission intensities to "p2" after the time period t4 has elapsed. The time periods t3 and t4 are determined based on the number of internal clock signals acquired from the emission-intensity switching timing register 16.

The DAC 21 generates an analog voltage signal based on the level (code) of the light-emission intensity output from the emission-intensity setting device 19 and outputs the corresponding analog voltage signal to the drive circuit 13.

As described above, the driving current Iop for the semiconductor laser LD can be set in the semiconductor laser driver 100 independently from the image control unit 6. That is, it is not necessary to transmit the driving current Iop of the semiconductor laser LD from the main board (see FIG. 3) mounting the image control unit 6 via a cable to the LD board mounting the semiconductor laser driver 100 and the effects of voltage drops and the voltage boosts due to the resistance of the cable can be eliminated, enabling high-accuracy light-emission intensity control.

(Adaption for Rapid Division)

The rapid division method is the way that capable of outputting two image data in one main scanning line. More specifically, the laser light emitted from one light source is divided into two lights via a half mirror, and an exposure process in two colors (for two photoconductors) can be performed by using one semiconductor laser LD and one semiconductor laser driver 100.

It is to be noted that the elements after the process of the polygon mirror are set to respective two for each color. In this method, in a comparative example, the laser light (semiconductor laser) emits light onto Y (yellow) photoconductor in the first half of a period corresponding to the image range in one main scanning line and emits light onto M (magenta) photoconductor in the last half of the period corresponding to the image range in one main scanning line.

The light-emission intensities are typically different among the receptive colors, it is necessary to change light-emission intensities between the yellow (Y) and magenta (M). Accordingly, the light-emission intensity is required for changing on the way while single main scanning line is scanned. In Particular, in a case in which the rapid division method is adapted, it is necessary to set four light-emission intensities, APC, synchronization detection, image 1(Y), and image 2 (M), while the single main scanning line is scanned.

In the semiconductor laser driver 100 when this rapid division method is adapted, the emission-intensity switching timing register 16 and the emission-intensity setting register 17 store respective switching timing data D-switch and the light level data D-level of light-emission intensity in accordance with the desired light-emission intensity, which facilitate setting of the light-emission intensity.

Figure 8:
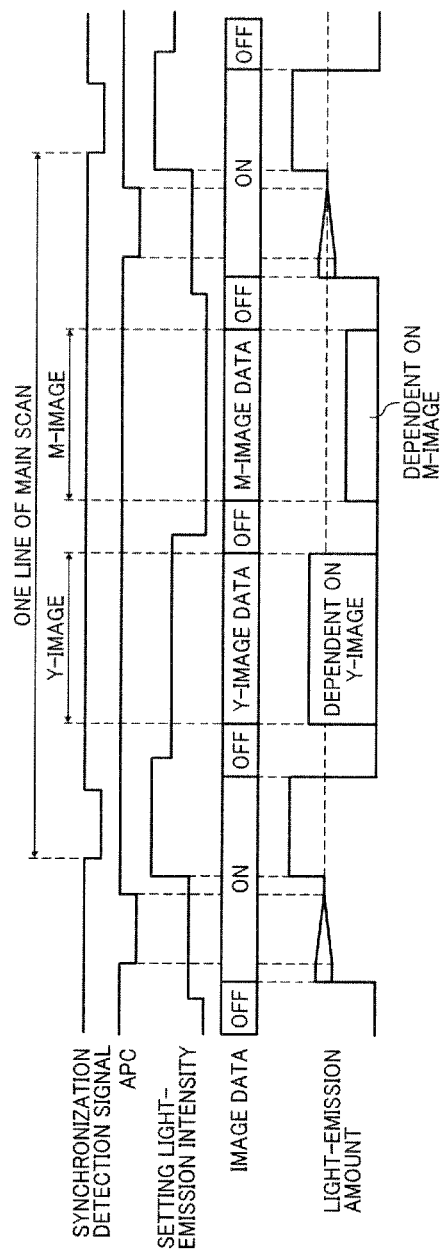
FIG. 8 is a timing chart illustrating setting light-emission intensity of the semiconductor laser in the semiconductor laser driver shown in FIG. 4 included in the image forming apparatus using rapid division method.

FIG. 8 is a timing chart illustrating setting light-emission intensity of the semiconductor laser LD in the semiconductor laser driver 100 included in the image forming apparatus using rapid division method. In FIG. 8, the light-emission intensity for Y image and light-emission intensity for M image are set in the one main scanning line.

The APC operation is performed before the normal synchronization detection signal is turned on. The synchronization detection signal is acquired after the determined light-emission intensity is accurately adjusted under APC.

When the quantity of light of the semiconductor laser LD fluctuates at the time of the synchronization detection, error occurs in the synchronization timing due to blunting of the signal. Accordingly, the quantity of light of the semiconductor laser LD is adjusted immediately before the synchronized detection. The quantity of light is set greatest for detecting the time of the synchronized detection.

The quantity of light under APC is an average data of the light-emission amount (emission intensity) when the two colors image data are output.

This is because, in a configuration in which the light-emission intensity signal is proportional to the light-emission amount, slightly error occurs. Therefore, it is preferable that the difference between the emission amount when APC is performed and the light-emission amount in the image range is set small, to the light-emission intensity when APC is performed.

Second Embodiment

As described above, the semiconductor laser driver 100 generates the internal clock signal and the APC signal based on a reference signal and controls the light-emission intensity and emission-intensity switching timing based on the internal clock signal and the APC signal.

By contrast, in the semiconductor laser driver 100A according to the second embodiment, the APC signal is input from the image control unit 6, and the he semiconductor laser driver 100A controls the light-emission intensity and the switching timing of the light-emission intensity based on the APC signal from image control unit 6 directly.

Figure 9:
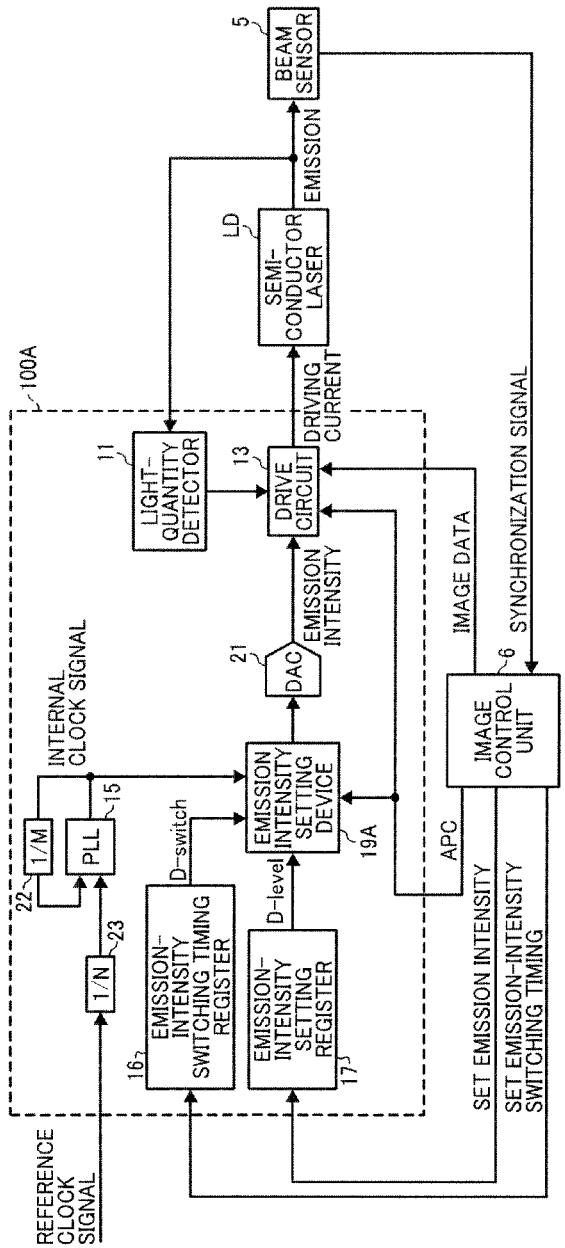
FIG. 9 is a block diagram illustrating a semiconductor laser driver according to a second embodiment.
Figure 10:
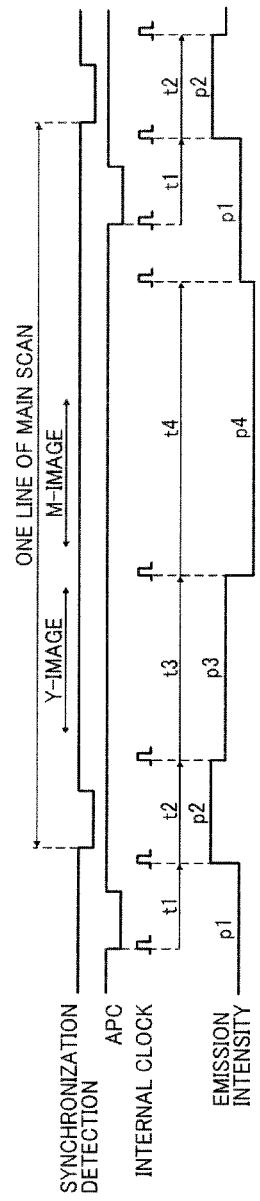
FIG. 10 is a timing chart illustrating setting light-emission intensity of the semiconductor laser in the semiconductor laser driver shown in FIG. 9.

FIG. 9 is a timing chart illustrating the semiconductor laser driver 100A according to the second embodiment. FIG. 10 is a timing chart illustrating setting light-emission intensity of the semiconductor laser LD in the semiconductor laser driver 100A of the second embodiment.

Below describes different point between the semiconductor laser driver 100 and the semiconductor laser driver 100A in the point of construction and operation.

The laser driver 100A does not include the APC timing register 18 and the APC signal generator 20. With this configuration, since the APC signal is directly input from the image control unit 6, it is not necessary to generate the APC signal in the semiconductor laser driver 100A.

In FIG. 9, an emission-intensity setting device 19a determines the switching timing of the light-emission intensity based on the switching timing of the light-emission intensity acquired from the light-emission switching timing register 16, the internal clock signal, and the APC signal. At this time, the emission-intensity setting device 19a reads out the light level data D-level of the light-emission intensity from the emission-intensity setting register 17. The emission-intensity setting device 19a the data (digital signal) indicating level of emission-intensity to the DAC 21 in accordance with the determined switching timing while switching the levels of the light-emission intensities based on the switching timing.

For example, as shown in FIG. 10, the light-emission intensity Po is set to the light-emission intensity at the time point after the time period t1 has elapsed from the time at which the APC signal falls then and changes the level of the light-emission intensities Po at "p3" at the time after the time period t2 has elapsed. Herein, the time periods t1, t2, t3, and t4 are determined by the number of clock signals acquired from the emission-intensity switching timing register 16.

As described above, the semiconductor laser driver 100A is similar to the semiconductor laser driver 100 shown in FIG. 4, and therefore, the configuration of the second embodiment can achieve effects similar to those of the semiconductor laser driver 100 as described above. Moreover, the semiconductor laser driver 100A can achieve the effects in simpler configuration than that of the semiconductor laser driver 100.

Third Embodiment

Figure 11:
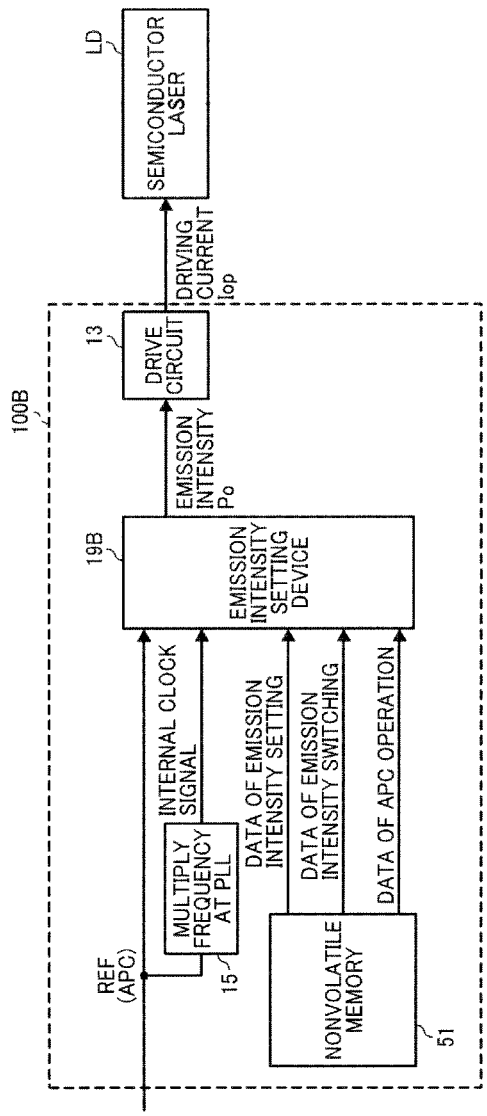
FIG. 11 is a block diagram illustrating a semiconductor laser driver according to a third embodiment.

FIG. 11 is a block diagram illustrating a semiconductor laser driver 100B according to a third embodiment. In FIG. 11, the semiconductor laser driver 100B includes a nonvolatile memory 51 functioning as the emission-intensity switching timing register 16, the emission-intensity setting register 17, and the APC timing register 18 in the laser driver shown in FIG. 4, or as the emission-intensity switching timing register 16, the emission-intensity setting register 17 in the laser driver 100A.

In the semiconductor laser driver 100 and 100A according to the first and the second embodiments receive light level data D-level of the light-emission intensity and the switching timing data D-switch of the light-emission intensities from the image control unit 6, and the emission-intensity switching timing register 16 and the emission-intensity setting register 17 stores the setting data when the power supply is turned on. By contrast, in the present embodiment, these setting data are stored in the nonvolatile memory 51, it is not necessary to set by reading out from the image control unit 6 when the power supply is turned on each time. Accordingly, the processes in the semiconductor laser driver 100 and 100B and the image control unit 6 can be performed by a relatively simple configuration when the power supply is turned on.

The each of above-described laser driver 100, 100A, and 100B may be integrated on single integrated chip (IC). Alternatively, the each of above-described laser driver 100, 100A, and 100B may be integrated on multiple chips (IC). Herein, it is preferable that the emission-intensity setting device 19 (19b, 19c) and the drive device 13 are integrated on single semiconductor elements (IC).

Numerous additional modifications and variations are possible in light of the above teachings. It is therefore to be understood that, within the scope of the appended claims, the disclosure of this patent specification may be practiced otherwise than as specifically described herein.

This patent specification claims priority from Japanese Patent Application No. 2010-062449, filed on Mar. 18, 2010 in the Japan Patent Office, which is hereby incorporated by reference herein in its entirety.

What is claimed is:

1. A semiconductor laser driver to drive at least one semiconductor laser, on a laser board that includes the semiconductor laser driver and the semiconductor laser, the semiconductor laser driver comprising:
    the laser board configured to be connected via a cable to a power supply board including a power supply and a ground voltage;
    a storage device to store emission-intensity switching data acquired from an image control unit to control light-emission intensity of the semiconductor laser when the power supply is turned on;
    an emission-intensity setting device to set the light-emission intensity based on the emission-intensity switching data stored in the storage device; and
    a drive circuit to generate a driving current to drive the semiconductor laser based on the light-emission intensity set by the emission-intensity setting device,
    wherein the driving current generated in the drive circuit is transmitted to the semiconductor laser,
    wherein the emission-intensity switching data indicates any of three or more light-emission intensity levels,
    wherein the storage device stores data for multiplying a frequency of a reference clock signal having a predetermined cycle by predetermined integer magnifications and generating a clock signal whose clock frequency is higher than the frequency of the reference clock signal as the emission-intensity switching data.

2. The semiconductor laser driver according to claim 1, wherein the emission intensity switching data stored in the storage device comprises data indicating multiple light-emission intensity levels.

3. The semiconductor laser driver according to claim 2, wherein the emission-intensity switching data stored in the storage device further comprises data indicating a timing at which to change the light-emission intensity level.

4. The semiconductor laser driver according to claim 1, wherein the storage device comprises a nonvolatile memory.

5. The semiconductor laser driver according to claim 1, wherein the emission-intensity setting device and the drive circuit are integrated onto a single integrated circuit (IC).

6. An image forming apparatus comprising:
    at least one semiconductor laser to emit light;
    a image control unit to generate image data and an automatic power control (APC) signal; and
    a laser board that includes the semiconductor laser and a semiconductor laser driver to drive the semiconductor laser, the laser board being configured to be connected via a cable to a power supply board including a power supply and a ground voltage, wherein the semiconductor laser driver is configured to receive the image data and the automatic power control signal output from the image control unit, the semiconductor laser driver comprising:

a storage device to store emission-intensity switching data acquired from the image control unit to control light-emission intensity of the semiconductor laser when the power supply is turned on;

an emission-intensity setting device to set the light-emission intensity based on the emission-intensity switching data stored in the storage device; and a drive circuit to generate a driving current of the semiconductor laser based on the light-emission intensity set by the emission-intensity setting circuit, the image data, and the automatic power control signal output from the image control unit, wherein the driving current generated in the drive circuit is transmitted to the semiconductor laser, wherein the emission-intensity switching data indicates any of three or more light-emission intensity levels, and wherein the storage device stores data for multiplying a frequency of a reference clock signal having a predetermined cycle by predetermined integer magnifications and generating a clock signal whose clock frequency is higher than the frequency of the reference clock signal as the emission-intensity switching data.

7. The image forming apparatus according to claim 6, wherein the emission-intensity switching data stored in the storage device of the semiconductor laser driver comprises data indicating multiple light-emission intensity levels.

8. The image forming apparatus according to claim 7, wherein the emission-intensity switching data stored in the storage device of the semiconductor laser driver further comprises data indicating a timing at which to switch light-emission intensity level.

9. The image forming apparatus according to claim 6, wherein the data storage device of the semiconductor laser driver comprises a nonvolatile memory.

10. The image forming apparatus according to claim 6, wherein the emission-intensity setting device and the drive circuit are integrated onto a single integrated circuit (IC).

11. The image forming apparatus according to claim 6, wherein the semiconductor laser driver further comprises a clock signal generator to multiply a frequency of a reference clock signal having a predetermined cycle by predetermined integer magnifications and generate a clock signal whose clock frequency is higher than the frequency of the reference clock signal, and the storage device stores data for multiplying the frequency of the reference clock signal by the predetermined integer magnifications, as the emission-intensity switching data.

12. A semiconductor laser driver to drive at least one semiconductor laser, on a laser board that includes the semiconductor laser driver and the semiconductor laser, the semiconductor laser driver comprising:

the laser board configured to be connected via a cable to a power supply board including a power supply and a ground voltage;

a storage device to store emission-intensity switching data acquired from an image control unit to control light-emission intensity of the semiconductor laser when the power supply is turned on;

an emission-intensity setting device to set the light-emission intensity based on the emission-intensity switching data stored in the storage device; and a drive circuit to generate a driving current to drive the semiconductor laser based on the light-emission intensity set by the emission-intensity setting device, wherein the driving current generated in the drive circuit is transmitted to the semiconductor laser, wherein the emission-intensity switching data indicates any of three or more lighte-mission intensity levels, and wherein the semiconductor laser driver further comprises a clock signal generator to multiply a frequency of a reference clock signal having a predetermined cycle by predetermined integer magnifications and generate a clock signal whose clock frequency is higher than the frequency of the reference clock signal, wherein the storage device stores data for multiplying the frequency of the reference clock signal by the predetermined integer magnifications, as the emission-intensity switching data.

* * * * *